United States Patent
Wong

(10) Patent No.: US 7,336,938 B1
(45) Date of Patent: Feb. 26, 2008

(54) PHASE-ALTERNATING MIXER WITH ALIAS AND HARMONIC REJECTION

(75) Inventor: Hee Wong, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 336 days.

(21) Appl. No.: 10/464,424

(22) Filed: Jun. 18, 2003

(51) Int. Cl.
*H04B 1/10* (2006.01)

(52) U.S. Cl. ...................... 455/296; 455/310
(58) Field of Classification Search .............. 455/330, 455/323, 139, 140
See application file for complete search history.

(56) References Cited

U.S. PATENT DOCUMENTS

| | | | |
|---|---|---|---|
| 3,626,311 A * | 12/1971 | Kraybill | 340/7.49 |
| 3,721,766 A * | 3/1973 | Hilbert | 381/7 |
| 4,156,204 A * | 5/1979 | Hargis | 331/12 |
| 5,241,702 A * | 8/1993 | Dent | 455/278.1 |
| 5,497,509 A * | 3/1996 | Lautzenhiser et al. | 455/208 |
| 5,844,939 A * | 12/1998 | Scherer et al. | 375/219 |
| 6,163,223 A * | 12/2000 | Kapetanic et al. | 331/2 |
| 6,363,124 B1 * | 3/2002 | Cochran | 375/326 |
| 6,658,237 B1 * | 12/2003 | Rozenblit et al. | 455/83 |
| 6,957,057 B2 * | 10/2005 | Das | 455/333 |
| 2004/0001560 A1 * | 1/2004 | Darabi | 375/303 |

* cited by examiner

*Primary Examiner*—Duc M. Nguyen
*Assistant Examiner*—Eric J Elcenko

(57) ABSTRACT

Rejection of local oscillator alias response is provided in a mixing circuit by (1) a switching mixer producing an output that changes at least twice between two states (e.g., high-low-high or low-high-low) during each local oscillator period, and (2) a charge integrator integrating current output from the switching mixer over the local oscillator period. The switching mixer and charge integrator produce a sampled data format, double sideband signal with serial cancellation of the switching mixer's alias responses. An extension unit connected in series with the switching mixer and charge integrator, and implementing a transform function computing a difference between consecutive samples, produces a cascading effect with the switching mixer and charge integrator, optionally producing additional nulls suppressing alias response at frequencies near the local oscillator frequency. A harmonic gating circuit between the switching mixer and charge integrator, controlled at a multiple of the local oscillator frequency, suppresses harmonic responses of the switching mixer.

19 Claims, 7 Drawing Sheets

PHASE-ALTERNATING MIXER WITH ALIAS AND HARMONIC REJECTION

TECHNICAL FIELD OF THE INVENTION

The present invention is directed, in general, to mixing circuits for radios and, more specifically, to harmonic and alias rejection for switching mixers.

BACKGROUND OF THE INVENTION

An architecture for high-performance direct conversion radios is disclosed in co-pending U.S. patent application Ser. No. 10/440,026 entitled "CHOPPER-DIRECT-CONVERSION (CDC) RADIO ARCHITECTURE" and filed May 16, 2003, the content of which is incorporated herein by reference. The architecture disclosed employs a phase-alternating mixer (PAM) that outputs a double-sideband (DSB) signal for use throughout the receiver circuitry. Such double-sideband signal paths eliminate the use of baseband frequencies that are generally problematic in large-scale circuit integration. In addition, problems associated with direct-conversion, such as local oscillator (LO) leakages, direct current (DC) offsets, low frequency noise and the like are all eliminated by relocating the local oscillator frequency away from the radio frequency (RF) employed for transmission. In addition, harmonic rejection for such an architecture is disclosed in co-pending U.S. patent application Ser. No. 10/457,825 entitled "HARMONIC REJECTION GATED-SWITCHING MIXER" and filed Jun. 9, 2003, the content of which is incorporated herein by reference.

When harmonic or alias signals are presented to the input of the radio, these unwanted signals interfere with the desired signal and degrade the quality of reception. To improve receiver quality, a surface acoustic wave (SAW) band select filter might be employed before the phase-alternating mixer to reject the unwanted signals. However, a better approach would be to design both the harmonic and alias rejection functions into the basic mixer circuitry.

There is, therefore, a need in the art for an alias and harmonic rejection circuit that may be integrated into any type of mixer circuit, such as a phase-alternating mixer of the type described above.

SUMMARY OF THE INVENTION

To address the above-discussed deficiencies of the prior art, it is a primary object of the present invention to provide, for use in a chopper-direct-conversion radio, a phase alternating mixer providing rejection of local oscillator alias response in a mixing circuit by (1) a switching mixer producing an output that changes at least twice between two states (e.g., high-low-high or low-high-low) during each local oscillator period and, (2) a charge integrator integrating current output from the switching mixer over the local oscillator period. The switching mixer and charge integrator produce a sampled data format, double sideband signal with serial cancellation of the switching mixer's alias responses. An extension unit connected in series with the switching mixer and charge integrator, and implementing a transform function computing a difference between consecutive samples, produces a cascading effect with the switching mixer and charge integrator, optionally producing additional nulls suppressing alias response at frequencies near the local oscillator frequency. A harmonic gating circuit between the switching mixer and charge integrator, controlled at a multiple of the local oscillator frequency, suppresses harmonic responses of the switching mixer. The resulting circuit is readily integrated as a phase alternating mixer into a chopper-direct-conversion radio.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4B, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
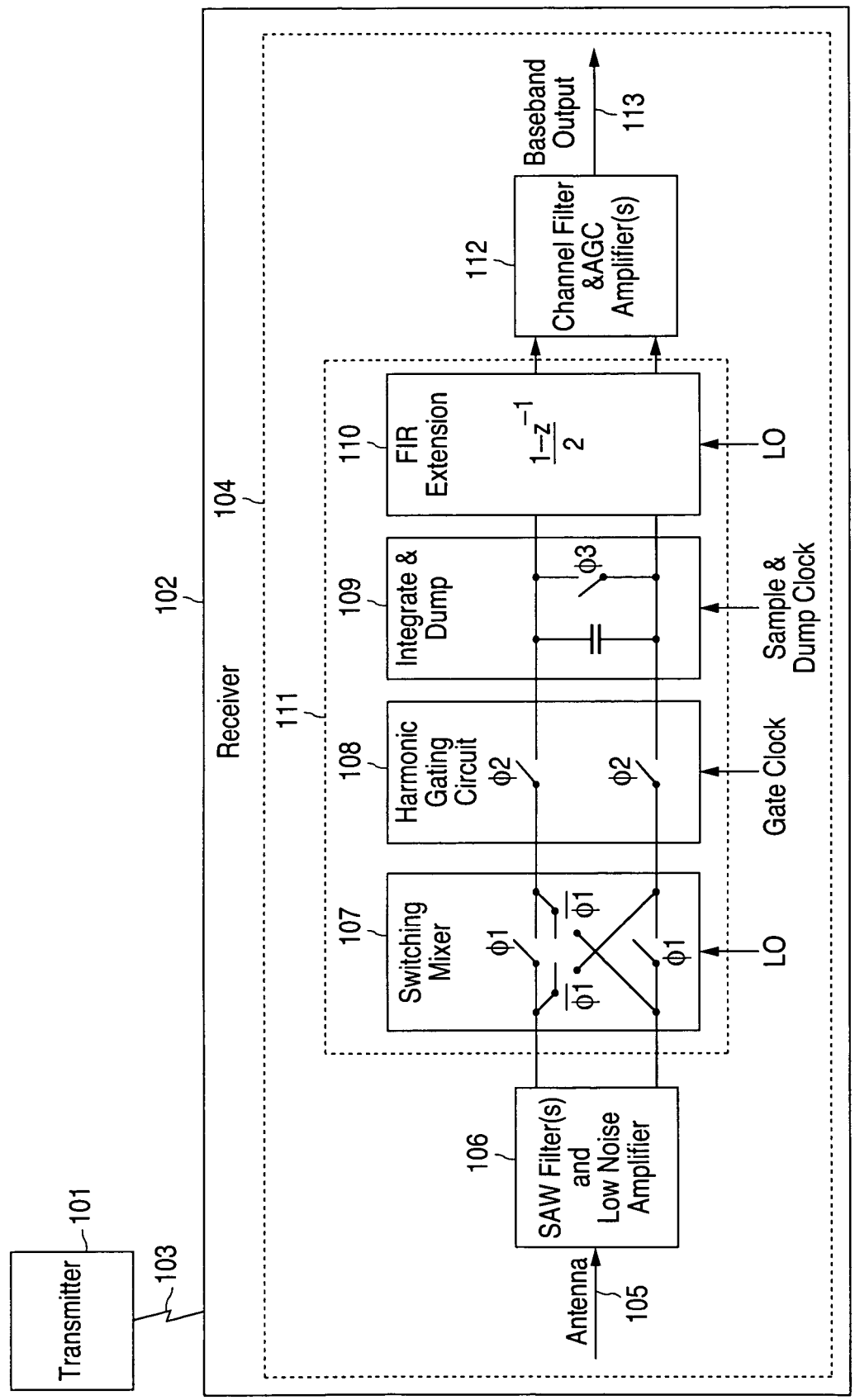
FIG. 1 depicts a wireless communications system including a chopper-direct-conversion receiver having an alias and harmonic rejection phase alternating mixer according to one embodiment of the present invention.

FIG. 1 depicts a wireless communications system including a chopper-direct-conversion receiver having an alias and harmonic rejection phase alternating mixer according to one embodiment of the present invention. Wireless communications system 100 includes a transmitter 101, a receiver 102, and at least one communications channel 103 communicably coupling the transmitter 101 and receiver 102. Wireless communications system 100 may be employed for voice communications, video transmission or data transmission. Accordingly, receiver 102 may be a mobile telephone, a satellite or terrestrial television receiver, a data processing system such as a wireless personal digital assistant (PDA) with Internet access capabilities, or some combination thereof.

Those skilled in the art will recognize that the complete structure and operation of a wireless communications system or a receiver therein are not depicted or described herein. Instead, for simplicity and clarity, only so much of a wireless communications system and associated receiver as is unique to the present invention or necessary for an understanding of the present invention is depicted and described.

Receiver 102 preferably employs the chopper-direct-conversion architecture described in the related application identified above. In one embodiment of the chopper-direct-conversion disclosed in the related application, two local oscillator (LO) frequencies are required to control two separate mixers for converting a received radio frequency (RF) signal to the double sideband (DSB) baseband output (BO), where the received frequency is required to be at the midpoint of those two frequencies. In an alternative embodiment, a single phase alternating mixer and local oscillator frequency are employed. For a single phase alternative mixer, a local oscillator source containing a long series of harmonic frequencies will cause the receiver to respond to multiple input signals having frequencies falling at or near the midpoint of any consecutive local oscillator frequency pair. Such responses are alias responses, distinct from harmonic responses since the consecutive local oscillator frequency pair need not be the harmonic frequencies creating these responses. Other frequency pairs, when present in a system producing a double sideband output frequency meeting the downstream circuit requirement, may create alias responses.

Accordingly, receiver 102 includes a circuit 104, preferably implemented in a single integrated circuit, receiving a wireless radio frequency (RF) signal on an input 105 from an antenna (not shown). The received signal is passed through surface acoustic wave (SAW) filter(s) and low noise amplifier (LNA) 106, then split into a differential signal and passed as dual inputs to a switching mixer 107 of the conventional configuration widely utilized in most direct-conversion radios and controlled by a local oscillator (LO) signal. A series-connected harmonic gating circuit 108 receives the outputs of switching mixer 107 and provides the harmonic rejection function, controlled by a gate clock signal running at twice (or more) the frequency of the local oscillator with an aperture (phase angle duration of the high portion of the duty cycle) of anywhere between 0° and 360° (preferably between 120° and 240°) depending on the harmonic(s) desired to be rejected.

The alias rejection circuit of the present invention utilizes a novel serial-cancellation technique inserting nulls at unwanted alias frequencies. The operating theory is very similar to tradition finite impulse response (FIR) filters, but with a substantially different implementation. The serial cancellation technique of the present invention takes advantage of the switching mixer property such that the FIR function is accomplished with virtually no additional circuitry, and none of significant delay or complexity, whereas traditional FIR filtering requires several delay/scaling elements and an adder.

The output of the harmonic gating circuit 108 is passed to an integrate and dump circuit 109 converting the continuous antenna input signal into a signal with a sampled data format of the type disclosed in the related application identified above. Integrate and dump circuit 109 employs a capacitor to integrate the output current from the SAW filter and LNA 106 (received via switching mixer 107 and harmonic gating circuit 108). The final integrated value is then sampled and held, with the charge dumped at the end of each local oscillator cycle. The combined effect of all the switches within the switching mixer 107 and the harmonic gating circuit 108 determine the integration aperture. The sampled integrated value is passed to an FIR extension 110, which is a two-tap FIR filter increasing the effective tap length of the alias rejection FIR structure embedded within the switching mixer 107 and the integrate and dump circuit 109, as described in further detail below.

The switching mixer 107, harmonic gating circuit 108, integrate and dump circuit 109 and FIR extension 110 combined form a phase alternating mixer 111. The output of the phase alternating mixer 111 is passed through a channel filter and automatic gain control (AGC) amplifier(s) 112 to produce the baseband output signal at output 113.

When all four elements 107-110 are employed, a full-featured phase alternating mixer with both alias and harmonic rejection is achieved. However, the elements 107-110 may also be selectively implemented to produce variations of the phase alternating mixer, including: a simple phase alternating mixer implemented with only the switching mixer 107 driven by a local oscillator input with a frequency equal to two-thirds that of the received radio frequency signal; a sampled-data phase alternating mixer implemented with the switching mixer 107 and the integrate and dump circuit 109; and a harmonic rejection phase alternating mixer implemented with the switching mixer 107, the harmonic gating circuit 108 and the integrate and dump circuit 109.

Many other combinations of the elements disclosed are possible. In the present invention, a full-featured phase alternating mixer is preferably employed. Therefore details of every possible option are not discussed herein for simplicity and clarity. For the purposes of illustration, however, the operation of both a phase alternating mixer with no alias rejection and a phase alternating mixer with alias rejection are described below. Both embodiments employ the structure depicted in FIG. 1, modified as indicated.

Figure 2A:
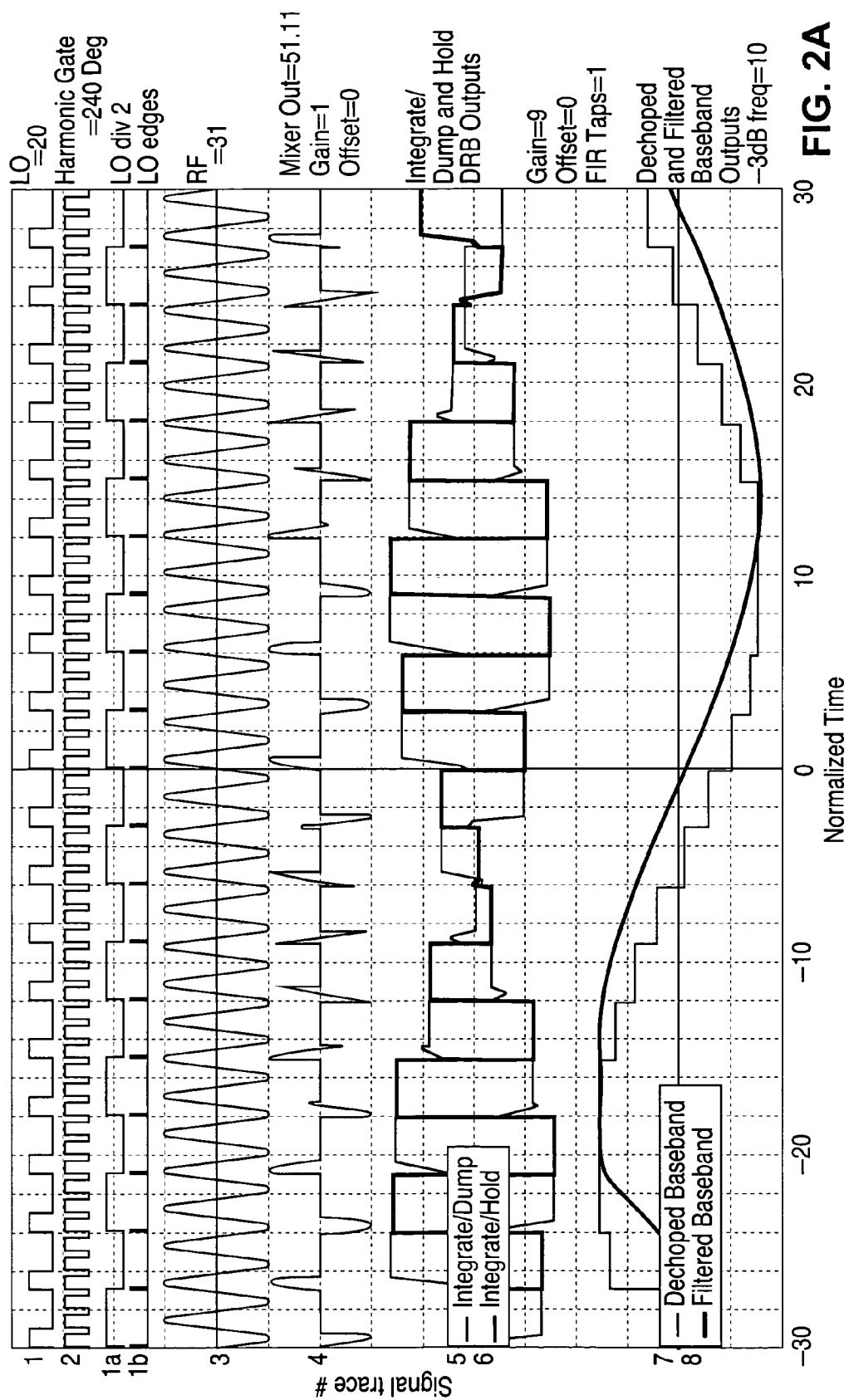
FIGS. 2A and 2B illustrate timing waveforms for the response of a phase alternating mixer without alias rejection according to one embodiment of the present invention.
Figure 2B:
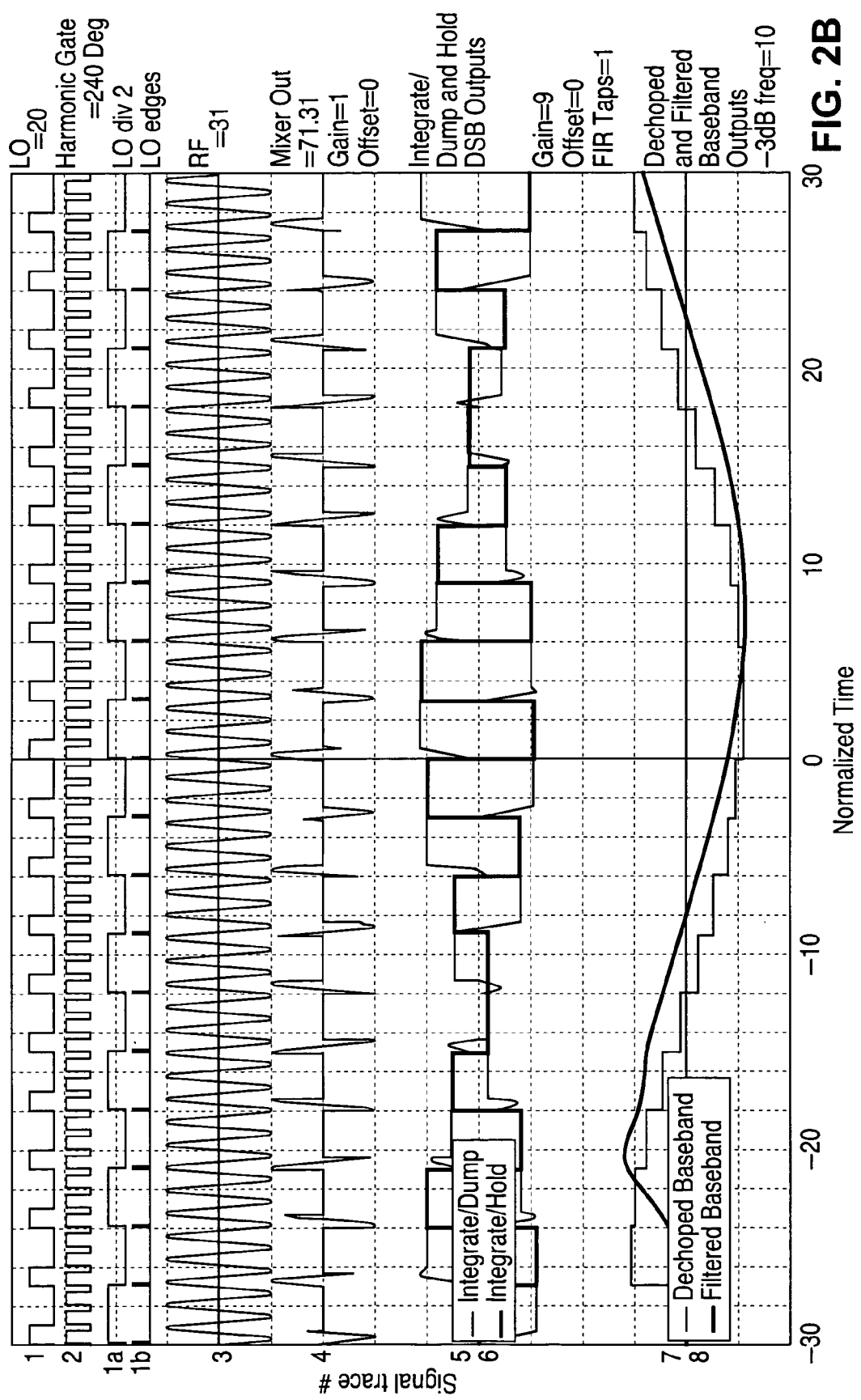

FIGS. 2A and 2B illustrate timing waveforms for the response of a phase alternating mixer with harmonic rejection but without alias rejection according to one embodiment of the present invention. In this embodiment, the switching mixer 107, the harmonic gating circuit 108 and the integrate and dump circuit 109 are implemented, but the FIR extension is bypassed (or implemented as a through function).

FIG. 2A illustrates application of the fundamental (i.e., transmission) frequency to the phase alternating mixer circuit of FIG. 1, while FIG. 2B raises the applied frequency to an alias frequency. In both FIGS. 2A and 2B, numbers on the left of the plot identify particular traces.

The first trace (1) in each plot illustrate the local oscillator (LO) signal controlling the switching mixer 107 and having a frequency arbitrarily selected for the purposes of illustration to equal a normalized value of 20. Trace 1a illustrates the local oscillator divided by 2, which is employed as the de-chop clock for a de-chopper circuit (not shown), essentially a de-multiplexer with the switch frequency at the chopping rate, as described in the related application identified above, to recover the original radio frequency signal after the output from phase alternating mixer 111 is filtered and processed in double sideband format. Trace 1b illustrates the local oscillator edges, and has no electrical significance but is provided for visual indication of the beginning and end of each local oscillator cycle.

The second trace (2) in each plot is the gate clock controlling the harmonic gating circuit 108, having a frequency equal to (LO×3)=60 and an aperture of 240° (where 240° is the high end of an aperture range beginning at 102°). Trace 3 in each plot is the antenna input, which for FIG. 2A is RF=[(LO×3/2)+offset]=31, where a frequency offset of 1 is added to the RF to create a beat frequency of 1 at the baseband outputs (traces 7 and 8, discussed below) to enhance the effectiveness of the illustration. Trace 3 may also be utilized as the current input to the phase alternating mixer 111 since the filtering and amplification in the SAW filter and LNA 106 does not alter the shape of the waveform.

Trace 4 in FIG. 2A is the harmonic gating circuit output, a signal originating from the current output of the switching mixer 107. In should be noted that the switching mixer in the exemplary embodiment is a modified mixer such that the output current is completely gated off when the local oscillator (trace 1) goes low, which may be accomplished by simply removing the two cross switches controlled by $\overline{\phi 1}$ inside the mixer. The switching mixer output is further gated off when the harmonic gating circuit gate clock (trace 2) goes low.

Trace 5 in FIG. 2A (the lighter of the two second-from-bottom superimposed traces) is the integrate and dump circuit output, where the capacitor is initially discharged at the beginning of each local oscillator cycle, then integrates the current pulse from the mixer output (trace 4) and, at the end of each local oscillator cycle, reads and holds the value of the final charge onto an integrate and hold signal (trace 6, the darker of the two second-from-bottom superimposed traces and lagging trace 5 in FIG. 2A). Trace 6 is the output reading and holding the final value of the integrate and dump circuit (trace 5) at the end of each local oscillator cycle, in double sideband format.

Trace 7 (the lighter of the two bottom super-imposed traces in FIG. 2A) is a de-chopped version of the integrate and hold output (trace 6), using a de-chop timing derived from the local oscillator divided by 2 (trace 1a). Trace 8 (the darker of the two bottom superimposed traces and lagging trace 7 in FIG. 2A) is the final baseband output of the phase alternating mixer.

Figure 3A:
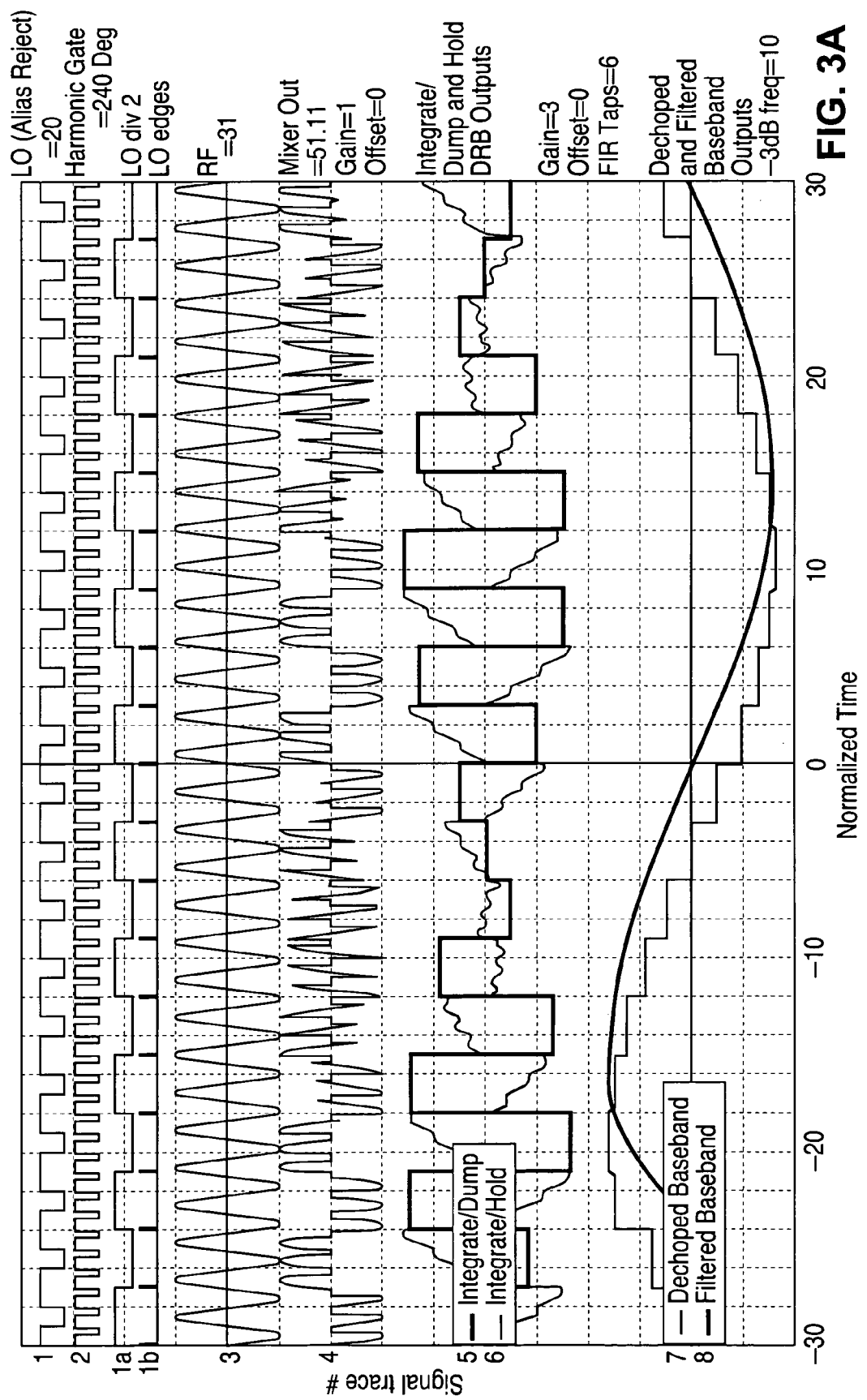
FIGS. 3A and 3B illustrate timing waveforms for the response of a full-featured phase alternating mixer with both harmonic and alias rejection according to one embodiment of the present invention.
Figure 3B:
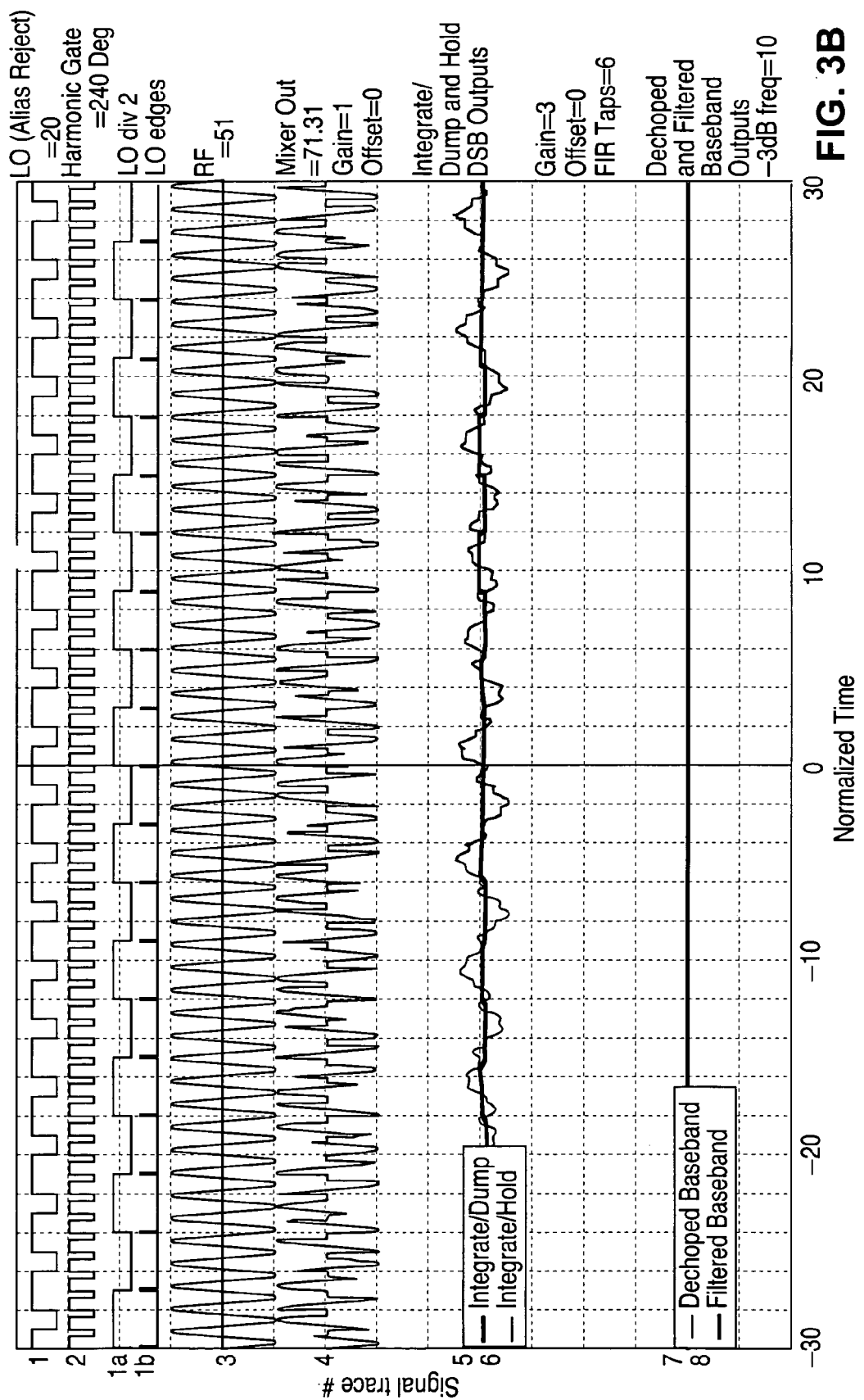

FIGS. 3A and 3B illustrate timing waveforms for the response of a full-featured phase alternating mixer with both harmonic and alias rejection according to one embodiment of the present invention. In this embodiment, a full implementation of the phase alternating mixer is employed, including the switching mixer 107 (with the cross-switches inside the mixer), the harmonic gating circuit 108, the integrate and dump circuit 109 and the FIR extension 110, which uses a straight through function (output equals input) for a 3 tap FIR filter but is enabled for a 6 tap FIR filter. FIG. 3A illustrates application of the fundamental frequency (31) to the phase alternating mixer circuit of FIG. 1, while FIG. 3B raises the applied frequency to the same alias frequency as FIG. 2B. As with FIGS. 2A and 2B, numbers on the left of the plots in FIGS. 3A and 3B identify particular traces. The traces depicted in FIG. 3A correspond to like-numbered traces in FIG. 2A described above.

FIGS. 2B and 3B illustrate the responses of the respective phase alternating mixer structures described when the applied input frequency (trace 3) is raised to one of the alias frequencies (51). In FIG. 2B, the filtered baseband signal (trace 8) exhibits a high output because the corresponding phase alternating mixer structure utilizes no alias rejection. In FIG. 3B, on the other hand, the full-featured phase alternating mixer includes the alias rejection elements, causing almost a total magnitude rejection of the filtered baseband (trace 8).

There are many other alias frequencies besides the alias frequency illustrated (51). For example, if the fundamental frequency of the local oscillator is selected to be 20, then there are harmonic frequencies at 40, 60, 80, 100, etc. Applying the chopper-direct-conversion algorithm, there are alias responses at 10, 30, 50, 70, 90, etc. If the targeted receive frequency is selected to be 30, then alias frequencies at 10, 50, 70 and 90 will require rejection. Since the alias frequency 90 is also the $3^{rd}$ harmonic response of the phase alternating mixer, the rejection must be contributed from the harmonic rejection function (harmonic gating circuit 108).

The frequencies described above are summarized in TABLE I:

TABLE I

| Frequencies | 0 | 10 | 20 | 30 | 40 | 50 | 60 | 70 | 80 | 90 | 100 |
|---|---|---|---|---|---|---|---|---|---|---|---|
| LO | * | | * | | * | | * | | * | | * |
| Receive RF | | | | w | | | | | | | |
| Alias | | u | | | | u | | u | | u | |
| Harmonic | | | | | | | | | | u | | where "*" denotes the local oscillator fundamental and harmonic frequencies, "w" denotes the wanted receive frequencies, and "u" denotes unwanted alias or harmonic frequencies.

The alias rejection of the present invention relies on the frequency notching property of classical FIR filters, with targeted responses first modeled with conventional FIR filters.

Figure 4A:
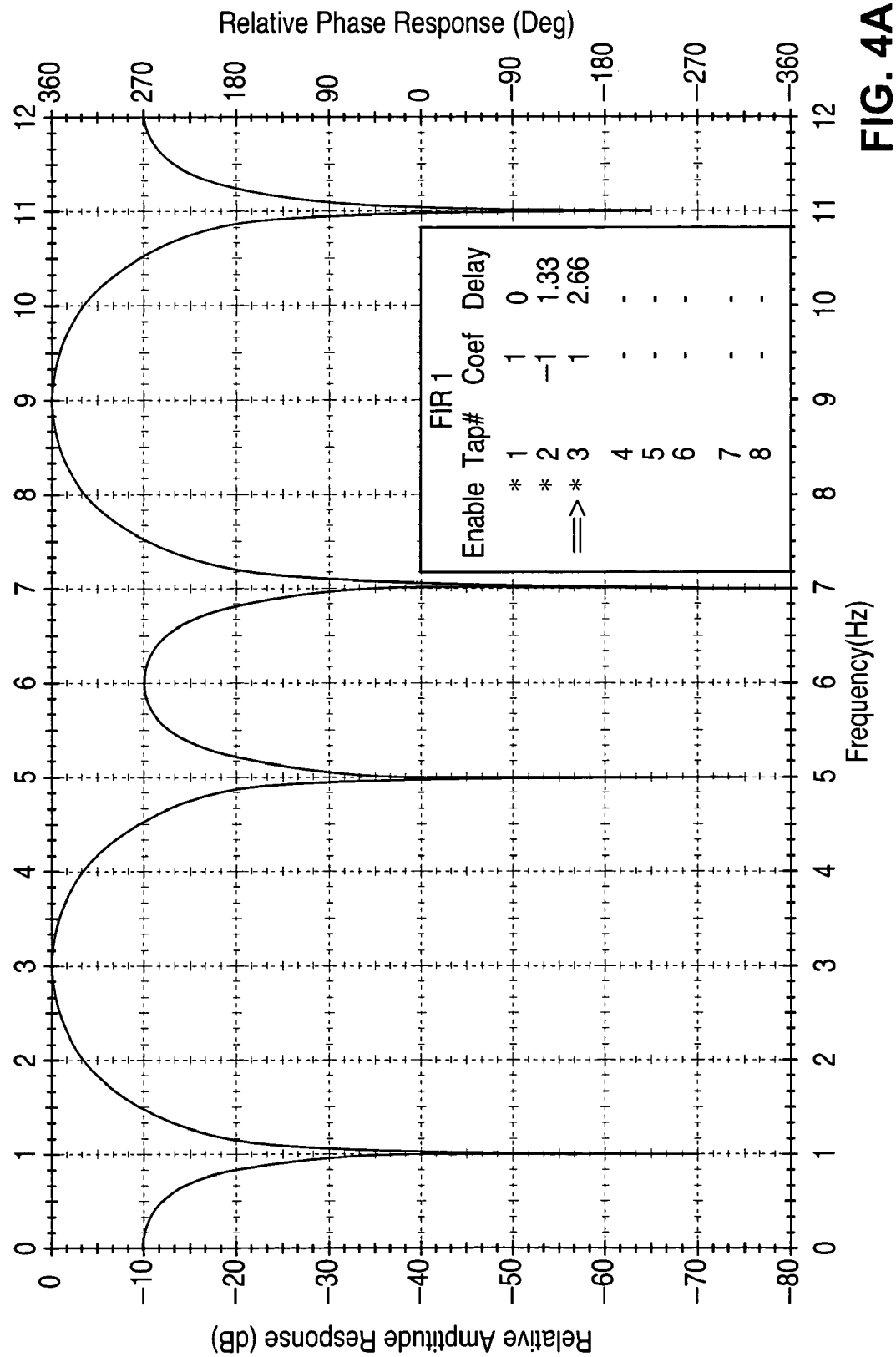
FIGS. 4A and 4B illustrate alias rejection filter responses and tap selection for implementing an alias rejection phase alternating mixer according to various embodiments of the present invention.
Figure 4B:
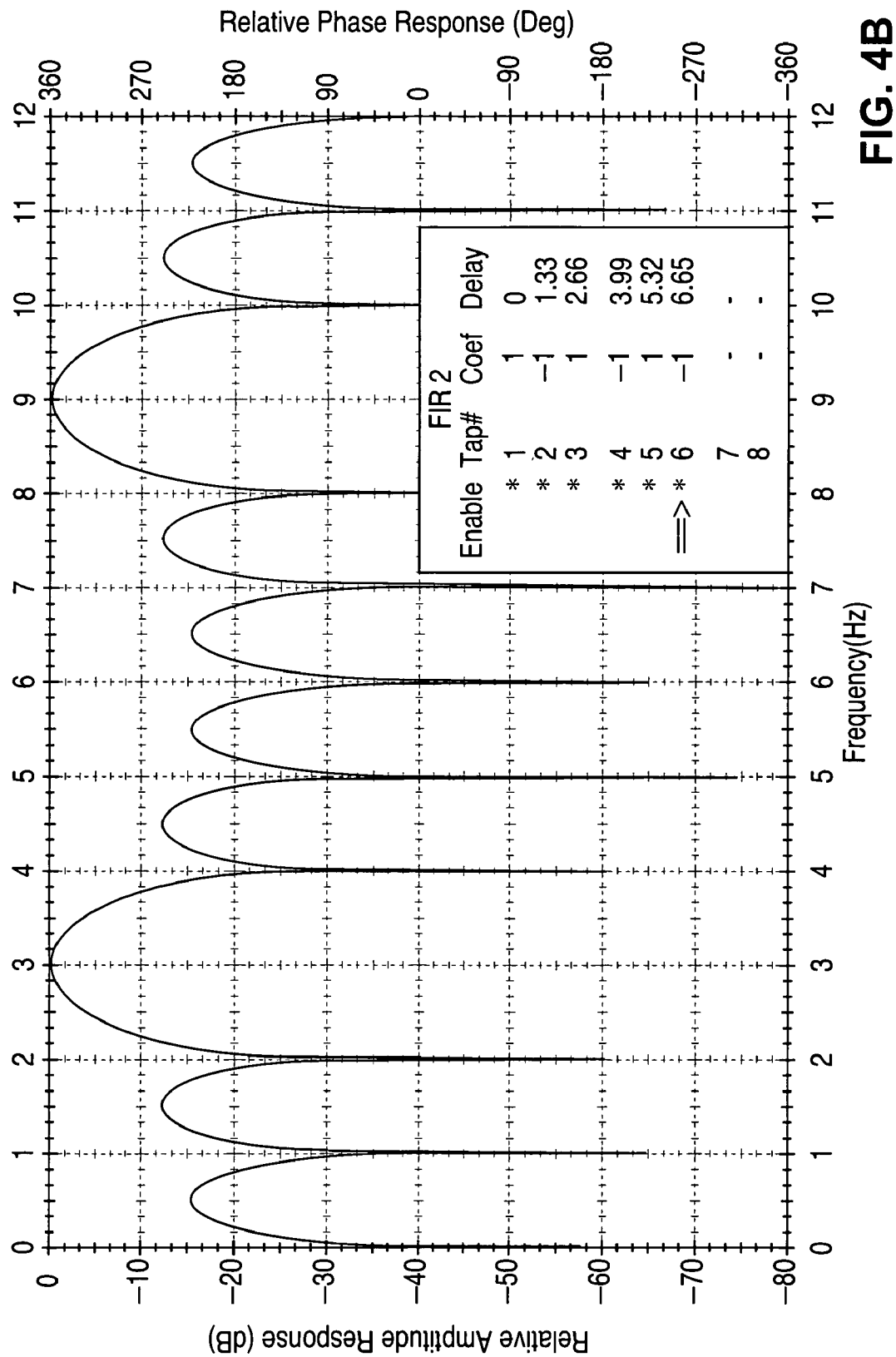

FIGS. 4A and 4B illustrate alias rejection filter responses and tap selection for implementing an alias rejection phase alternating mixer according to various embodiments of the present invention. FIG. 4A illustrates a low cost, 3 tap FIR implementation providing all basic rejection at the alias frequencies, while FIG. 4B illustrates a 6 tap FIR implementation providing additional frequency nulls for further enhancing the phase alternating mixer signal handling capability.

FIG. 4A illustrates a 3 tap FIR implementation providing nulls at frequencies 1, 5, 7 and 11 Hertz (Hz). In addition, the filter exhibits maximum response at 3 and 9 Hz. Applying a frequency scaling factor of ten (×10) to this FIR implementation, the result fits the desired alias rejection profile of the phase alternating mixer described above. For example, the response peak at 3 Hz times the scale factor

(10) equals 30, which is the receive frequency selected for the phase alternating mixer. Note that the 3 tap FIR implementation contributes no rejection at the $3^{rd}$ harmonic of 90 (9×10=90), at which frequency the rejection is solely contributed by the harmonic rejection function.

By adding three more taps to the 3 tap FIR implementation, the resulting 6 tap FIR implementation of FIG. 4B offers additional nulls at frequencies of 0, 2, 4, 6, 8, 10, 12, etc. Applying the 10× scaling, these nulls relocate to the fundamental and harmonics of the local oscillator (i.e., 0, 20, 40, etc.), including the direct current (DC) frequency of 0. These additional nulls enhance the phase alternating mixer for better signal handling capability. For instance, an unwanted interference close to the local oscillator frequency may cause low frequency beats at the output of the phase alternating mixer. Such output is similar to a direct-conversion radio, but, in contrast, those beats are wanted direct-conversion baseband output. In a chopper-direct-conversion architecture employing a phase alternating mixer, those beats should not reach the output because the channel filter and the de-chopper reject these low frequency components. However, those beats consume dynamic range and may cause signal overloading at the front-end circuitry. Fortunately, these beats may be easily removed using the 6 tap FIR implementation, greatly improving suppression of intermodulation (IM) distortion of the final radio as a result.

The 3 tap FIR alias rejection filter is very simply implemented, using a full implementation of the switching mixer 107 (with the cross-switches inside the mixer) and selection of the local oscillator and gate clock driving signals. For the local oscillator signal depicted by trace 2 in FIGS. 2A through 3B, one complete local oscillator cycle is equivalent to the period between two consecutive pulses of the local oscillator edges (trace 1b). Within each local oscillator cycle, there are three timeslot segments each having a duration of 120° and with a level sequence of high, low and high. When the local oscillator signal is high, the radio frequency current (trace 3) is gated onto the harmonic gating circuit output (trace 4) by the harmonic gating circuit. When the local oscillator signal is low, the polarity of the gated output current is reversed (that is, the two cross switches inside the switching mixer 107 provide the inversion).

This high-low-high gating mechanism emulates the taps of a FIR, while the summing function is accomplished by the integrate and dump circuit 109 placed after the gates of the switching mixer 107 and the harmonic gating circuit 108. Apparently, the tap coefficients are 1, −1 and 1 (i.e., durations of highs and lows are all equal). Note that this serial-cancellation technique imposes virtually no additional cost, while a traditional FIR filter requires three delay elements and an adder. A low-high-low inverted local oscillator driving signal is also valid for producing a similar FIR response, except that the final output is inverted.

A 6 tap FIR alias rejection filter is implemented by adding the FIR extensions 110 to the 3 tap FIR alias rejection filter. FIR extensions 110 implements a transfer function of $(1+z^{-1})/2$, modeling a generic 2 tap FIR where the output is the sum of two consecutive input samples and the amplitude scaling of ½ is irrelevant and application specific. Note that the transfer function depicted in FIG. 1 is given as $(1-z^{-1})/2$, where the FIR output is defined as the difference (not the sum) of two consecutive samples. This variation is particularly arranged for the double sideband signal, since the double sideband signal format imposes a signal inversion at every other sample. Therefore, the combined effect still returns the sum at the output of the FIR filter.

Although there are only two taps in the FIR extension, the equivalent total number of taps of the combined FIR is 6 (2×3) due to the cascading effect of the FIR extension 110 with the 3 tap FIR implementation of switching mixer 107, harmonic gating circuit 108 and integrate and dump circuit 109. The difference function (i.e., $1-z^{-1}$) creates a DC break to the signal path, creating a significant advantage to the phase alternating mixer because intrinsic DC offset and bias levels cannot propagate through that DC break. However, the low frequency content of the baseband signal is not corrupted by the DC break because the spectrum is shifted up to the double sideband frequencies. Implementing the DC break is extremely low cost because the signal is in sampled data format with a very high (in comparison to baseband frequencies) frequency pole. In contrast, implementing an equivalent continuous-time DC blocking capacitor in silicon is essentially physically impossible for direct-conversion radios.

Although the phase alternating mixer described herein is a full-featured implementation, various alternatives reshaping the design for different applications are possible. Besides the value of 30 for the target receive radio frequency, other values such as 50, 70, etc. may be selected while keeping the original local oscillator frequency at 20. These frequency options reduce the power consumption of the radio by relatively decreasing the chopping frequency of the double sideband signal. However, the alias and harmonic rejection circuitries require modification to accommodate new rejection frequencies due to relocation of the radio frequency. In fact, raising the radio frequency effectively increases the RF/LO ratio, thus creating more low frequency aliases to be rejected. Fortunately, the increase of the RF/LO ratio also provides more time slots to the serial FIR, allowing additional taps to be added to the serial FIR and thus providing more frequency nulls.

On the other hand, adding taps to the FIR extension 110 is straightforward because the signal received by that element is in sampled data format. In contrast to employing the FIR topology, infinite impulse response (IIR) is also practical when a steeper rejection slope is desired. Group delay distortion due to IIR is irrelevant when a low cost digital equalizer may be added to correct the distortion after the analog-to-digital converter (ADC).

The switching mixer output is described above as changing at least twice during each local oscillator period. It should be noted that, if the chopper direct conversion architecture and phase-alternating mixer are changed to employ other frequency combinations as described above, the switching mixer output will change between the two states more than twice during each local oscillator period, depending on the RF/LO ratio, and will therefore emulate a different FIR function. Various possible RF/LO ratios (expressed as the number of RF half-cycles in each LO period), the corresponding FIR function, and the corresponding number of switching mixer output changes occurring in each LO period, are summarized in TABLE II:

TABLE II

| RF/LO ratio | FIR | Number of switching mixer output changes per LO period |
|---|---|---|
| 3 | 101 | 2 |
| 4 | 1010 | 3 |
| 5 | 10101 | 4 |
| 6 | 101010 | 5 |
| 7 | 1010101 | 6 |

Changing the integrate and dump circuit 109 to a push-pull configuration will allow more "dump-time" for discharging the integrating capacitor. Advanced technique such as integration with no dump are also possible, draining the previous charge by pumping an opposite charge into the capacitor, which then requires no "dump-time" because the pumping process happens during the integrating interval. Adding a switched-capacitor decimator to further decrease the chopping frequency of the double sideband signal is also beneficial when extremely low operating power is important.

The chopper-direct-conversion radio architecture offers solutions to virtually all problems found in conventional direct-conversion radios, with nearly all of those solutions relying on intrinsic circuit properties rather than brute-force techniques such as local oscillator shielding and DC offset cancellation loops. Therefore, radios implemented with the chopper-direct-conversion architecture can reach an incomparable performance level.

The phase alternating mixer key to the chopper-direct-conversion radio architecture is not an implementation-impossible circuit, but instead has a simple architecture and moderate circuit size. Switching speed requirements are within reach of current technology and, more importantly, no canceling mechanism spanning several circuit blocks (such as the Weaver Image Rejection Mixer) is required, which is essential if precision and consistent performance is desired.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A mixing circuit comprising:
   a switching mixer receiving a radio frequency signal and switching the received radio frequency signal under control of a local oscillator signal; and
   a charge integrator receiving a signal derived from an output of the switching mixer and integrating current for the received signal over a period of the local oscillator signal,
   the switching mixer and the charge integrator suppressing one or more alias responses of the mixing circuit to the local oscillator signal,
   wherein the received radio frequency signal is a differential signal; and
   wherein the switching mixer comprises parallel switches and cross switches controlled by the local oscillator signal, the parallel switches gating the received differential radio frequency signal to corresponding outputs of the switching mixer, the cross-switches gating the received differential radio frequency signal to opposite outputs of the switching mixer.

2. The mixing circuit according to claim 1, further comprising:
   an extension unit receiving samples from the charge integrator and implementing a transfer function based on consecutive samples,
   wherein the extension unit increases a number of alias responses of the mixing circuit that are suppressed.

3. A mixing circuit comprising:
   a switching mixer receiving a radio frequency signal and switching the received radio frequency signal under control of a local oscillator signal;
   a charge integrator receiving a signal derived from an output of the switching mixer and integrating current for the received signal over a period of the local oscillator signal, the switching mixer and the charge integrator suppressing one or more alias responses of the mixing circuit to the local oscillator signal, and
   an extension unit receiving samples from the charge integrator and implementing a transfer function based on consecutive samples, wherein the extension unit increases a number of alias responses of the mixing circuit that are suppressed,
   wherein the received radio frequency signal is a differential signal and wherein the switching mixer comprises:
      parallel switches controlled by the local oscillator signal and gating the received differential radio frequency signal to corresponding outputs of the switching mixer; and
      cross-switches controlled by an inversion of the local oscillator signal and gating the received differential radio frequency signal to opposite outputs of the switching mixer.

4. The mixing circuit according to claim 3, wherein the extension unit implements a transfer function based on a difference between the consecutive samples.

5. The mixing circuit according to claim 1, further comprising:
   a harmonic gating circuit coupled between the switching mixer and the charge integrator and controlled by a gate clock having a frequency that is a multiple of a frequency of the local oscillator signal, the harmonic gating circuit suppressing harmonic responses of the mixing circuit to the local oscillator signal.

6. The mixing circuit according to claim 1, wherein the switching mixer and the charge integrator emulate an impulse response filter.

7. The mixing circuit according to claim 1, wherein the switching mixer and charge integrator form a portion of a phase alternating mixer.

8. A receiver including the mixing circuit according to claim 1, the receiver further comprising:
   one or more of: a first filter and a first amplifier coupling an antenna to the switching mixer; and
   one or more of: a second filter and a second amplifier coupled to an output of the switching mixer.

9. The receiver according claim 8, wherein the receiver employs a chopper-direct-conversion configuration.

10. A wireless communications system including the receiver according claim 8, the wireless communications system further comprising:
    a transmitter communicably coupled to the receiver by a wireless communications channel.

11. A mixing method comprising:
    receiving a radio frequency signal at a switching mixer and switching the received radio frequency signal through the switching mixer under control of a local oscillator signal; and
    receiving a signal derived from an output of the switching mixer at a charge integrator and integrating current for the received signal over a period of the local oscillator signal;
    wherein a frequency of the local oscillator signal relative to a frequency of the received radio frequency signal causes the switching mixer and the charge integrator to suppress one or more alias responses of the mixing circuit to the local oscillator signal;

wherein the received radio frequency signal is a differential signal; and where switching the received radio frequency signal through the switching mixer comprises controlling parallel switches and cross-switches within the switching mixer based on the local oscillator signal, the parallel switches gating the received differential radio frequency signal to corresponding outputs of the switching mixer, the cross-switches gating the received differential radio frequency signal to opposite outputs of the switching mixer.

12. The mixing method according to claim 11, further comprising:

receiving samples from the charge integrator at an extension unit and implementing a transfer function based on consecutive samples, wherein the extension unit increases a number of alias responses of the mixing circuit that are suppressed.

13. A mixing method comprising:

receiving a radio frequency signal at a switching mixer and switching the received radio frequency signal through the switching mixer under control of a local oscillator signal;

receiving a signal derived from an output of the switching mixer at a charge integrator and integrating current for the received signal over a period of the local oscillator signal, wherein a frequency of the local oscillator signal relative to a frequency of the received radio frequency signal causes the switching mixer and the charge integrator to suppress one or more alias responses of the mixing circuit to the local oscillator signal; and receiving samples from the charge integrator at an extension unit and implementing a transfer function based on consecutive samples, wherein the extension unit increases a number of alias responses of the mixing circuit that are suppressed, wherein the received radio frequency signal is a differential signal and wherein switching the received radio frequency signal through the switching mixer comprises:

controlling parallel switches within the switching mixer by the local oscillator signal and gating the received differential radio frequency signal to corresponding outputs of the switching mixer; and controlling cross-switches within the switching mixer by an inversion of the local oscillator signal and gating the received differential radio frequency signal to opposite outputs of the switching mixer.

14. The mixing method according to claim 13, wherein the extension unit implements a transfer function based on a difference between the consecutive samples.

15. The mixing method according to claim 11, further comprising:

controlling a harmonic gating circuit coupled between the switching mixer and the charge integrator by a gate clock having a frequency that is a multiple of the frequency of the local oscillator signal, the harmonic gating circuit suppressing harmonic responses of the mixing circuit to the local oscillator signal.

16. The mixing method according to claim 11, wherein the switching mixer and the charge integrator emulate an impulse response filter.

17. The mixing method according to claim 11, wherein the switching mixer and charge integrator form a portion of a phase alternating mixer.

18. A mixing circuit comprising:

a switching mixer receiving a differential radio frequency signal, wherein parallel switches within the switching mixer are controlled by a local oscillator signal and gate the received differential frequency signal to counterpart outputs of the switching mixer, and wherein cross-switches within the switching mixer are controlled by an inversion of the local oscillator signal and gate the received differential radio frequency signal to opposite outputs of the switching mixer, a charge integrator receiving a signal derived from the outputs of the switching mixer and integrating current for the received signal over a period of the local oscillator signal, wherein a frequency of the local oscillator signal relative to a frequency of the received radio frequency signal causes the switching mixer and the charge integrator to suppress one or more alias responses of the mixing circuit to the local oscillator signal; and a harmonic gating circuit coupled between the switching mixer and the charge integrator and controlled by a gate clock having a frequency that is a multiple of the frequency of the local oscillator signal, the harmonic gating circuit suppressing harmonic responses of the mixing circuit to the local oscillator signal.

19. The mixing circuit of claim 1, wherein:

the current for the received signal is repeatedly integrated, each integration occurring over one period of the local oscillator signal; and the charge integrator comprises a capacitor, the capacitor charged during one integration of the current and discharged prior to a following integration of the current.

\* \* \* \* \*

UNITED STATES PATENT AND TRADEMARK OFFICE
CERTIFICATE OF CORRECTION

PATENT NO. : 7,336,938 B1
APPLICATION NO. : 10/464424
DATED : February 26, 2008
INVENTOR(S) : Hee Wong It is certified that error appears in the above-identified patent and that said Letters Patent is hereby corrected as shown below:

Column 11, line 3, delete "where" and replace with --wherein--.

Signed and Sealed this

Thirteenth Day of October, 2009

David J. Kappos
*Director of the United States Patent and Trademark Office*